(12) United States Patent
Nakayama et al.

(10) Patent No.: US 11,493,647 B2
(45) Date of Patent: Nov. 8, 2022

(54) RADIATION DETECTOR AND RADIATION DETECTION METHOD

(71) Applicant: KABUSHIKI KAISHA TOSHIBA, Tokyo (JP)

(72) Inventors: Kohei Nakayama, Kawasaki (JP); Atsushi Wada, Kawasaki (JP); Fumihiko Aiga, Kawasaki (JP); Isao Takasu, Setagaya (JP); Yuko Nomura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/184,675

(22) Filed: Feb. 25, 2021

(65) Prior Publication Data

US 2022/0082711 A1 Mar. 17, 2022

(30) Foreign Application Priority Data

Sep. 15, 2020 (JP) .............................. JP2020-154915

(51) Int. Cl.
*G01T 1/20* (2006.01)
*H01L 31/0224* (2006.01)
*H01L 31/08* (2006.01)

(52) U.S. Cl.
CPC ........ *G01T 1/2002* (2013.01); *H01L 31/0224* (2013.01); *H01L 31/085* (2013.01)

(58) Field of Classification Search
CPC .. G01T 1/2002; H01L 31/0224; H01L 31/085
See application file for complete search history.

(56) References Cited

U.S. PATENT DOCUMENTS

2018/0329080 A1* 11/2018 Brabec .................... G01T 1/202
2021/0055435 A1 2/2021 Aiga et al.
2021/0231588 A1* 7/2021 Karim .................... A61B 6/484

FOREIGN PATENT DOCUMENTS

JP 4205789 B2 1/2009
JP 2021-34447 A 3/2021

* cited by examiner

*Primary Examiner* — Hugh Maupin
(74) *Attorney, Agent, or Firm* — Maier & Maier, PLLC

(57) ABSTRACT

A radiation detector includes a first detecting part including a first organic detection layer and a first layer, and a second detecting part including a second organic detection layer. The first layer includes a first material and a first thickness. The second detecting part does not include the first layer. The second detecting part does not include a second layer, or the second detecting part includes the second layer that includes at least one of a second material or a second thickness. The second material is different from the first material. The second thickness is different from the first thickness. The first material includes at least one of a first organic material or a first element. The second material includes at least one of a second organic material or a second element.

19 Claims, 3 Drawing Sheets

RADIATION DETECTOR AND RADIATION DETECTION METHOD

CROSS-REFERENCE TO RELATED APPLICATIONS

This application is based upon and claims the benefit of priority from Japanese Patent Application No. 2020-154915, filed on Sep. 15, 2020; the entire contents of which are incorporated herein by reference.

FIELD

Embodiments of the invention generally relate to a radiation detector and a radiation detection method.

BACKGROUND

For example, the observation of the state of an irradiated body, treatment, and the like are performed by irradiating radiation on the irradiated body. It is desirable to increase the detection accuracy of a radiation detector that detects the intensity (e.g., the dose rate, etc.) of the radiation.

DETAILED DESCRIPTION

Figure 1:
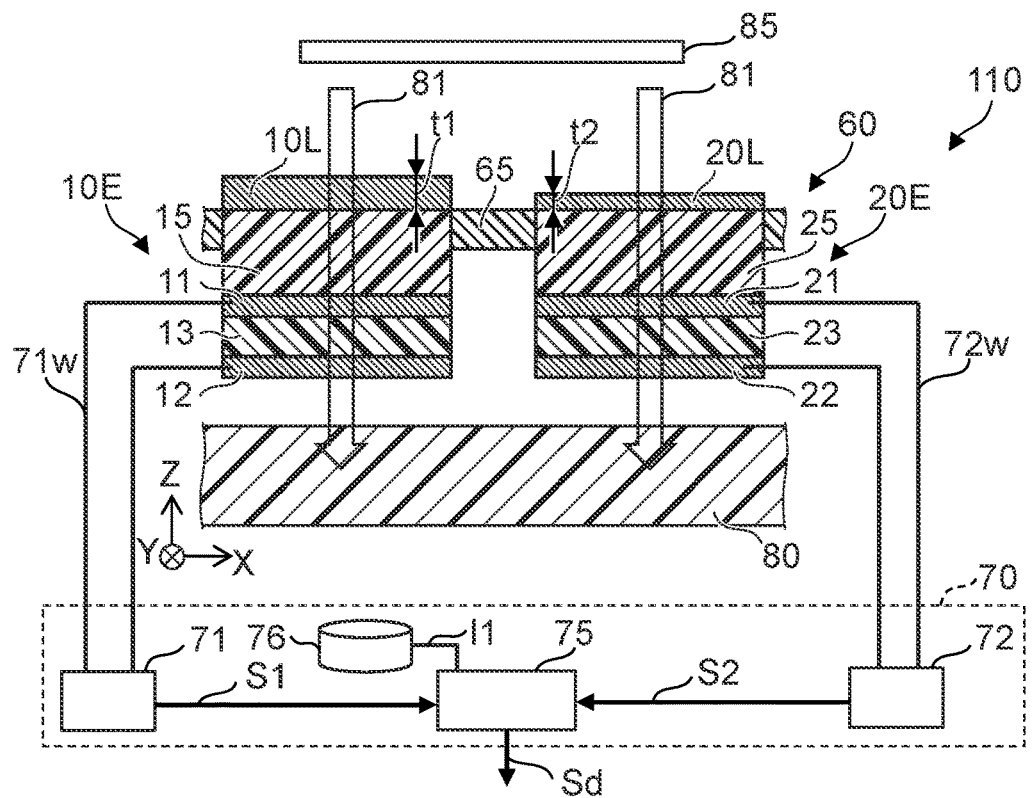
FIG. 1 is a schematic cross-sectional view illustrating a radiation detector according to a first embodiment.

According to one embodiment, a radiation detector includes a first detecting part including a first organic detection layer and a first layer, and a second detecting part including a second organic detection layer. The first layer includes a first material and a first thickness. The second detecting part does not include the first layer. The second detecting part does not include a second layer, or the second detecting part includes the second layer that includes at least one of a second material or a second thickness. The second material is different from the first material. The second thickness is different from the first thickness. The first material includes at least one of a first organic material or a first element. The first element includes at least one selected from the group consisting of Al, Mg, Be, B, C, Fe, Co, Ni, and Cu. The second material includes at least one of a second organic material or a second element. The second element includes at least one selected from the group consisting of Al, Mg, Be, B, C, Fe, Co, Ni, and Cu.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a radiation detector according to a first embodiment.

As shown in FIG. 1, the radiation detector 110 according to the embodiment includes a first detecting part 10E and a second detecting part 20E. The first detecting part 10E includes a first organic detection layer 13 and a first layer 10L. The second detecting part 20E includes a second organic detection layer 23. The second detecting part 20E does not include the first layer 10L. In the example, the second detecting part 20E further includes a second layer 20L. As described below, the second detecting part 20E may not include the second layer 20L.

The direction from the first organic detection layer 13 toward the first layer 10L is taken as a Z-axis direction. One direction perpendicular to the Z-axis direction is taken as an X-axis direction. A direction perpendicular to the Z-axis direction and the X-axis direction is taken as a Y-axis direction. For example, the Z-axis direction corresponds to the stacking direction of the first organic detection layer 13 and the first layer 10L.

For example, the first organic detection layer 13 and the first layer 10L spread substantially parallel to the X-Y plane. The second organic detection layer 23 and the second layer 20L spread substantially parallel to the X-Y plane.

The first layer 10L includes a first material and a first thickness t1. The first thickness t1 is the length along the Z-axis direction.

When the second detecting part 20E includes the second layer 20L, the second layer 20L includes at least one of a second material that is different from the first material, or a second thickness t2 that is different from the first thickness t1. The second thickness t2 is the length along the Z-axis direction.

The first material includes at least one of a first organic material or a first element. The first element includes at least one selected from the group consisting of Al, Mg, Be, B, C, Fe, Co, Ni, and Cu. Such a first element includes, for example, a light metal.

The second material includes at least one of a second organic material or a second element. The second element includes at least one selected from the group consisting of Al, Mg, Be, B, C, Fe, Co, Ni, and Cu. Such a second element includes, for example, a light metal.

For example, radiation 81 is generated by a radiation generator 85. The radiation 81 is incident on the first and second detecting parts 10E and 20E. The radiation 81 passes through these detecting parts and is incident on an irradiated body 80. In one example, the radiation 81 includes X-rays. The radiation 81 may include γ-rays. The irradiated body 80 is, for example, a human body or the like. For example, the radiation 81 is irradiated on the human body or the like; and an observation of the state of the human body, treatment, etc., are performed. The irradiated body 80 may be an object. The radiation 81 may be irradiated on the object; and detection of the state (e.g., an injury, etc.) of the object, etc., may be performed.

In the first detecting part 10E, the radiation 81 is incident on the first organic detection layer 13 via the first layer 10L. A first signal S1 that corresponds to the intensity (e.g., the dose rate, etc.) of the radiation 81 is obtained from the first organic detection layer 13. The first signal S1 corresponds to the characteristics of the first layer 10L.

In the second detecting part 20E, the radiation 81 is incident on the second organic detection layer 23 via the second layer 20L. A second signal S2 that corresponds to the intensity (e.g., the dose rate, etc.) of the radiation 81 is obtained from the second organic detection layer 23. As described above, the second layer 20L includes at least one of the second material that is different from the first material, or the second thickness t2 that is different from the first thickness t1. Therefore, the second signal S2 is different from the first signal S1. Even when the second detecting part 20E does not include the second layer 20L, the second signal S2 is different from the first signal S1.

Thus, multiple mutually-different signals are obtained. For example, by performing processing that uses these signals, the intensity (e.g., the dose rate, etc.) of the radiation 81 can be detected with high accuracy. A radiation detector can be provided in which the detection accuracy can be increased. An example of the signal processing according to the embodiment is described below.

In the example as shown in FIG. 1, the first detecting part 10E further includes a first electrode 11 and a first counter electrode 12. The first electrode 11 is between the first counter electrode 12 and the first layer 10L. The first organic detection layer 13 is between the first counter electrode 12 and the first electrode 11.

As shown in FIG. 1, the second detecting part 20E further includes a second electrode 21 and a second counter electrode 22. The second organic detection layer 23 is between the second counter electrode 22 and the second electrode 21. When the second detecting part 20E includes the second layer 20L, the second electrode 21 is between the second counter electrode 22 and the second layer 20L.

For example, the radiation 81 is incident on the first electrode 11, the first organic detection layer 13, and the first counter electrode 12 via the first layer 10L. For example, the radiation 81 is incident on the second electrode 21, the second organic detection layer 23, and the second counter electrode 22 via the second layer 20L.

For example, when the radiation 81 is incident on an organic detection layer, a charge that corresponds to the intensity of the radiation 81 is generated in the organic detection layer. The charge can be extracted as a current by applying a bias voltage between the electrode and the counter electrode. The organic detection layer is, for example, an organic semiconductor layer. When the detection layer includes an organic material, a reduction of the intensity of the radiation 81 passing through the radiation detector 110 can be suppressed.

It is favorable for at least one of the first electrode 11, the second electrode 21, the first counter electrode 12, or the second counter electrode 22 to include, for example, an oxide conductor, a light metal, etc. (e.g., at least one selected from the group consisting of Al, Mg, and C, etc.). The reduction of the intensity of the radiation 81 passing through the radiation detector 110 can be suppressed thereby.

In the example as shown in FIG. 1, the first detecting part 10E includes a first base body 15. The first base body 15 is located between the first electrode 11 and the first layer 10L. The first base body 15 supports the first counter electrode 12, the first organic detection layer 13, and the first electrode 11. The first base body 15 supports the first layer 10L.

In the example as shown in FIG. 1, the second detecting part 20E includes a second base body 25. The second base body 25 is located between the second electrode 21 and the second layer 20L. The second base body 25 supports the second counter electrode 22, the second organic detection layer 23, and the second electrode 21. The second base body 25 supports the second layer 20L.

It is favorable for at least one of the first base body 15 or the second base body 25 to include at least one of glass or an organic material. The reduction of the intensity of the radiation 81 passing through the radiation detector 110 can be suppressed thereby.

The radiation detector 110 may include a supporter 65. The supporter 65 supports the first detecting part 10E and the second detecting part 20E. The supporter 65 includes, for example, an organic material. The reduction of the intensity of the radiation 81 passing through the radiation detector 110 can be suppressed.

The radiation detector 110 includes a detection component 60. The detection component 60 includes the first detecting part 10E and the second detecting part 20E. As described below, multiple detection components 60 may be provided. For example, the multiple detection components 60 are arranged in the X-Y plane.

As shown in FIG. 1, the radiation detector 110 may include a processor 70. The processor 70 is electrically connected to the first and second detecting parts 10E and 20E. In the example, the processor 70 is electrically connected to the first detecting part 10E by a first connection member 71w. The processor 70 is electrically connected to the second detecting part 20E by a second connection member 72w. At least a portion of at least one of the first connection member 71w or the second connection member 72w may include a light metal, etc. (e.g., at least one selected from the group consisting of Al, Mg, and C, etc.). The reduction of the intensity of the radiation 81 passing through the radiation detector 110 can be suppressed. The transmittance for the radiation 81 of at least a portion of at least one of the first connection member 71w or the second connection member 72w is, for example, not less than 90%.

In the example, the processor 70 includes a first detection circuit 71, a second detection circuit 72, and a processing circuit 75. For example, the first detection circuit 71 is configured to apply a bias voltage between the first counter electrode 12 and the first electrode 11. The first detection circuit 71 is configured to detect a first current flowing in the first detecting part 10E when the radiation 81 to be detected is incident on the first detecting part 10E. The first detection circuit 71 is configured to output the first signal S1 that corresponds to the first current. For example, the second detection circuit 72 is configured to apply a bias voltage between the second counter electrode 22 and the second electrode 21. The second detection circuit 72 is configured to detect a second current flowing in the second detecting part 20E when the radiation 81 to be detected is incident on the second detecting part 20E. The second detection circuit 72 is configured to output the second signal S2 that corresponds to the second current.

The first signal S1 and the second signal S2 are supplied to the processing circuit 75. The processing circuit 75 is configured to output a detection signal Sd based on the first and second signals S1 and S2. The detection signal Sd corresponds to the intensity (e.g., the dose rate) of the radiation 81. The processing circuit 75 may be, for example, a computer including a CPU (Central Processing Unit), etc. The processing circuit 75 includes, for example, an electrical circuit. The first signal S1 and the second signal S2 may be an analog signal or a digital signal. The first signal S1 and the second signal S2 may be digital information. The detection signal Sd may be an analog signal or a digital signal. The detection signal Sd may be digital information. The detection signal Sd may include information relating to at least one of the dose rate or the dose.

The processor 70 may include a memory part 76. The memory part 76 is configured to store information I1 (e.g., data relating to calibration curves, correction coefficients, etc.) that is used in the processing of the processing circuit 75. The information I1 is supplied from the memory part 76 to the processing circuit 75. The memory part 76 may be provided outside the radiation detector 110. The radiation detector 110 may acquire the necessary information I1 via any communication path such as a cloud, etc.

An example of the processing of the processor 70 is described below.

Figure 2:
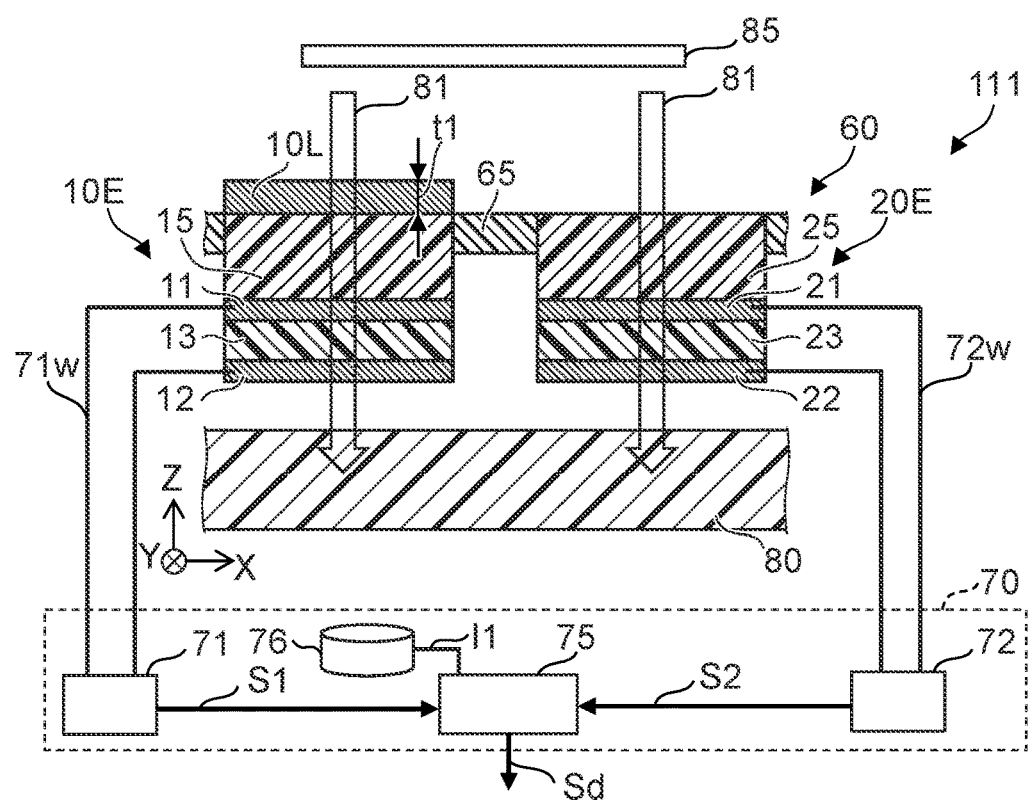
FIG. 2 is a schematic cross-sectional view illustrating a radiation detector according to the first embodiment.

FIG. 2 is a schematic cross-sectional view illustrating a radiation detector according to the first embodiment.

In the radiation detector 111 according to the embodiment as shown in FIG. 2, the second detecting part 20E does not include the second layer 20L. Otherwise, the configuration of the radiation detector 111 may be similar to the configuration of the radiation detector 110.

Figure 3:
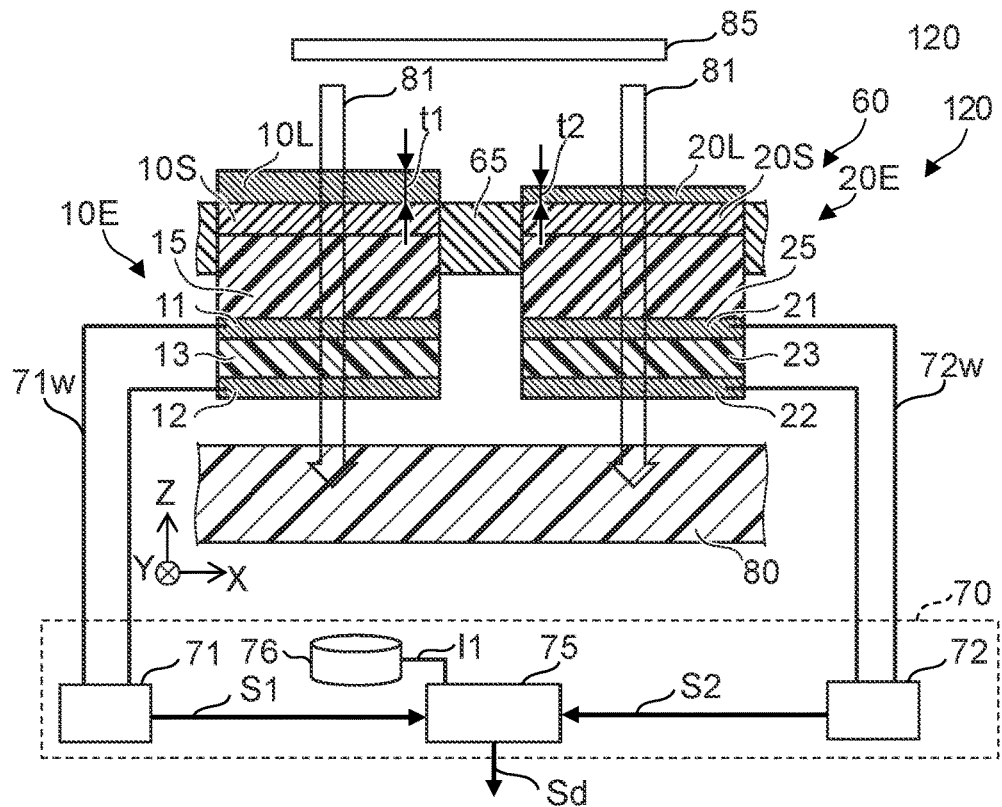
FIG. 3 is a schematic cross-sectional view illustrating a radiation detector according to the first embodiment.

FIG. 3 is a schematic cross-sectional view illustrating a radiation detector according to the first embodiment.

In the radiation detector 120 according to the embodiment as shown in FIG. 3, the first detecting part 10E includes a first scintillator layer 10S; and the second detecting part 20E includes a second scintillator layer 20S. Otherwise, the configuration of the radiation detector 120 may be similar to the configuration of the radiation detector 110.

In the radiation detector 120, the first scintillator layer 10S is between the first organic detection layer 13 and the first layer 10L. In the example, the first detecting part 10E further includes the first electrode 11 and the first counter electrode 12. The first organic detection layer 13 is between the first counter electrode 12 and the first layer 10L. The first electrode 11 is between the first organic detection layer 13 and the first layer 10L. The first scintillator layer 10S is between the first electrode 11 and the first layer 10L.

The second scintillator layer 20S is between the second organic detection layer 23 and the second layer 20L when the second detecting part 20E includes the second layer 20L. As described below, the second scintillator layer 20S is stacked with the second organic detection layer 23 when the second detecting part 20E does not include the second layer 20L. In the example, the second detecting part 20E includes the second electrode 21, the second counter electrode 22, and the second layer 20L. The second organic detection layer 23 is between the second counter electrode 22 and the second layer 20L. The second electrode 21 is between the second organic detection layer 23 and the second layer 20L. The second scintillator layer 20S is between the second electrode 21 and the second layer 20L.

For example, the radiation 81 passes through the first layer 10L and is incident on the first scintillator layer 10S. Light (e.g., visible light) that corresponds to the radiation 81 is generated in the first scintillator layer 10S. The light is incident on the first organic detection layer 13 via the first electrode 11. A charge that corresponds to the light is generated in the first organic detection layer 13. The charge that is generated is extracted as a current by applying a bias voltage between the first counter electrode 12 and the first electrode 11. The first organic detection layer 13 is, for example, an organic photoelectric conversion layer.

For example, the radiation 81 passes through the second layer 20L (or does not pass through the second layer 20L) and is incident on the second scintillator layer 20S. Light (e.g., visible light) that corresponds to the radiation 81 is generated in the second scintillator layer 20S. The light is incident on the second organic detection layer 23 via the second electrode 21. A charge that corresponds to the light is generated in the second organic detection layer 23. The charge that is generated is extracted as a current by applying a bias voltage between the second counter electrode 22 and the second electrode 21. The second organic detection layer 23 is, for example, an organic photoelectric conversion layer.

Higher sensitivity is obtained by providing the scintillator layers.

For example, the transmittance of the first electrode 11 for the first peak wavelength of the light emitted from the first scintillator layer 10S is greater than the transmittance of the first counter electrode 12 for the first peak wavelength. For example, the transmittance of the second electrode 21 for the second peak wavelength of the light emitted from the second scintillator layer 20S is greater than the transmittance of the second counter electrode 22 for the second peak wavelength. The first electrode and the second electrode 21 are, for example, light-transmissive.

For example, the light transmittance of the first counter electrode 12 for the first peak wavelength is greater than the light reflectance of the first electrode 11 for the first peak wavelength. For example, the light reflectance of the second counter electrode 22 for the second peak wavelength is greater than the light reflectance of the second electrode 21 for the second peak wavelength. The first electrode 11 and the second electrode 21 are, for example, light-reflective. The second peak wavelength may be substantially equal to the first peak wavelength.

In one example, at least one of the first electrode 11 or the second electrode 21 may include an oxide including at least one element selected from the group consisting of In, Sn, Zn, and Ti. The first electrode 11 and/or the second electrode 21 has a high light transmittance when these materials are included. For example, a high transmittance for visible light is obtained. High detection sensitivity is obtained. For example, a high transmittance for the radiation 81 is obtained in the first and second electrodes 11 and 21.

In one example, at least one of the first counter electrode 12 or the second counter electrode 22 includes at least one selected from the group consisting of Al, Mg, Be, B, and C. For example, a high reflectance for visible light is obtained. The light is more efficiently converted into the current. Higher detection sensitivity is obtained. For example, a high transmittance for the radiation 81 is obtained in the first and second counter electrodes 12 and 22.

For example, the first scintillator layer 10S and the second scintillator layer 20S may include a third organic material. For example, the first material of the first layer 10L includes the first organic material. For example, the refractive index of the first organic material is less than the refractive index of the third organic material. The refractive index is the refractive index for the first peak wavelength described above. For example, the second material of the second layer 20L includes the second organic material. For example, the refractive index of the second organic material is less than the refractive index of the third organic material. The refractive index is the refractive index for the second peak wavelength described above. For example, the light is more efficiently converted into the current by total internal reflections.

According to the embodiment, the transmittance of the first detecting part 10E for the radiation 81 to be detected is, for example, not less than 80%. The transmittance may be not less than 85%. The transmittance may be not less than 90%.

For example, the transmittance of the second detecting part 20E for the radiation 81 is not less than 80%. The transmittance may be not less than 85%. The transmittance may be not less than 90%.

Figure 4:
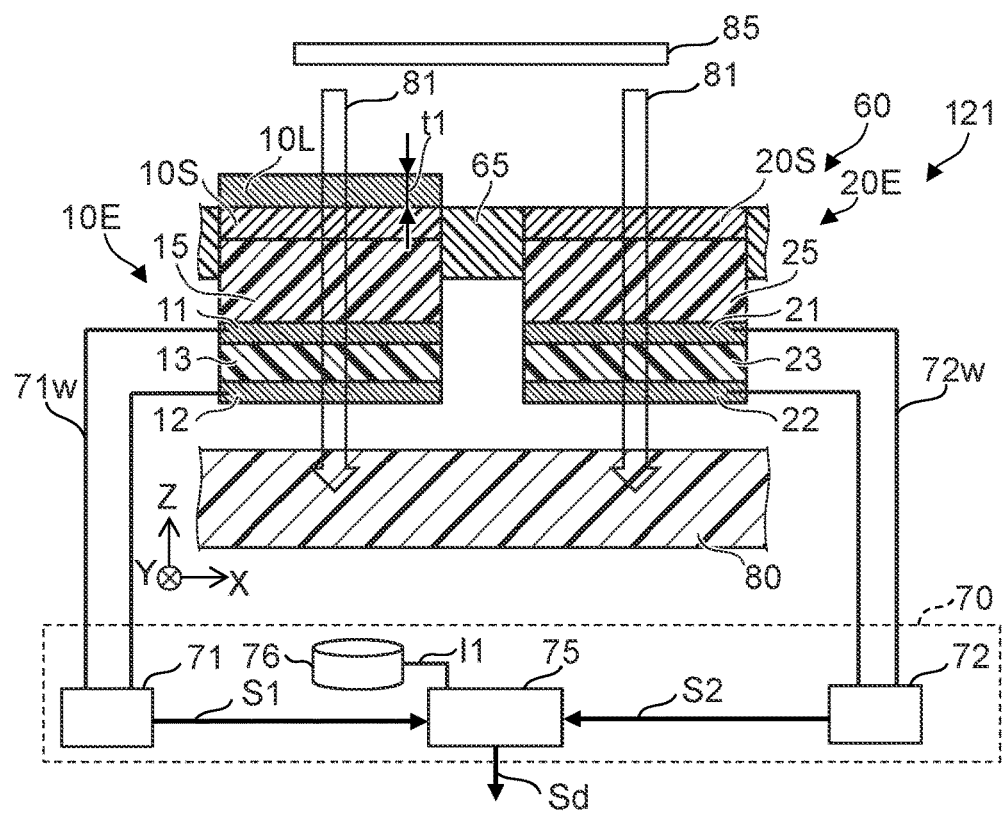
FIG. 4 is a schematic cross-sectional view illustrating a radiation detector according to the first embodiment.

FIG. 4 is a schematic cross-sectional view illustrating a radiation detector according to the first embodiment.

In the radiation detector 121 according to the embodiment as shown in FIG. 4, the second detecting part 20E does not include the second layer 20L. Otherwise, the configuration of the radiation detector 121 may be similar to the configuration of the radiation detector 120.

In the radiation detectors 111, 120, and 121 as well, a radiation detector can be provided in which the detection accuracy can be increased. In the radiation detectors 111, 120, and 121 as well, the processor 70 described above may be provided.

An example of an operation of the processor 70 will now be described. In the following example, the radiation 81 is X-rays.

Figure 5:
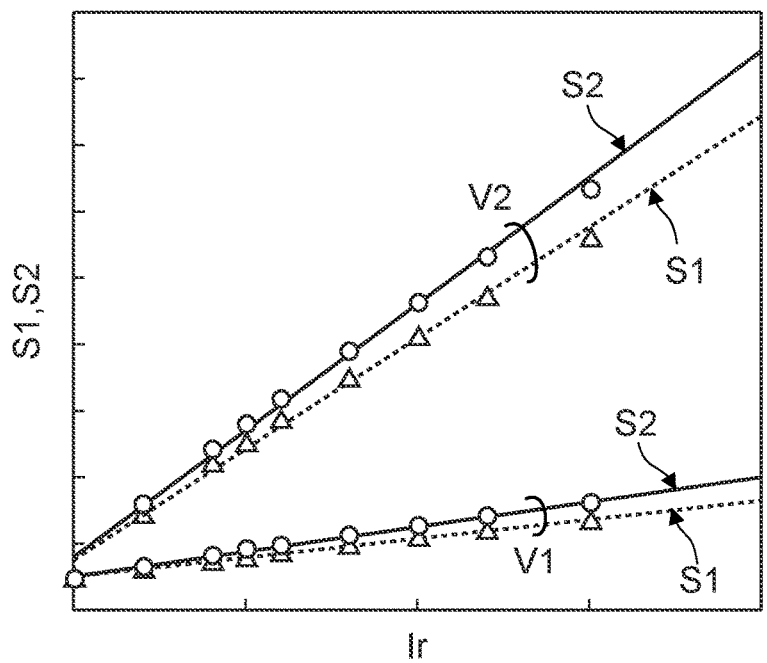
FIG. 5 is a graph illustrating characteristics of the radiation detector according to the first embodiment.

FIG. 5 is a graph illustrating characteristics of the radiation detector according to the first embodiment.

FIG. 5 illustrates the first signal S1 and the second signal S2 that are obtained when the radiation 81 is incident on the first and second detecting parts 10E and 20E. The horizontal axis of FIG. 5 corresponds to a current Ir supplied to the radiation generator 85 that generates the radiation 81. The dose rate of the radiation 81 is dependent on the current Ir. The vertical axis of FIG. 5 corresponds to the intensities of the first and second signals S1 and S2. For example, the first signal S1 corresponds to the detection current obtained from the first detecting part 10E. For example, the second signal S2 corresponds to the detection current obtained from the second detecting part 20E. FIG. 5 illustrates characteristics for different voltages applied to the radiation generator 85. In the example of FIG. 5, a first applied voltage V1 is 100 kV. A second applied voltage V2 is 300 kV.

As shown in FIG. 5, the first signal S1 and the second signal S2 linearly change with respect to the current Ir for both the first applied voltage V1 and the second applied voltage V2.

The change rate (the slope) of the first and second signals S1 and S2 with respect to the change of the current Ir for the second applied voltage V2 is different from the change rate (the slope) of the first and second signals S1 and S2 with respect to the change of the current Ir for the first applied voltage V1. It is considered that this is because the energy distribution of the radiation 81 that is generated is different for different voltages applied to the radiation generator 85.

As shown in FIG. 5, the second signal S2 is different from the first signal S1 for the same applied voltage. In the example, the second signal S2 is larger than the first signal S1. The processing circuit 75 is configured to output the detection signal Sd based on such a first signal S1 and such a second signal S2.

According to the embodiment, the first signal S1 and the second signal S2 are detected. The detected combination of the first and second signals S1 and S2 exists as one set each time the applied voltage and the current Ir are changed.

In one example, information that relates to the relationship between the combination of the first and second signals S1 and S2 and the intensity (e.g., the dose rate, etc.) of the radiation 81 is prestored in the memory part 76, etc. The processor 70 may detect the intensity (e.g., the dose rate, etc.) of the radiation 81 based on the detected value of the first signal S1, the detected value of the second signal S2, and the stored information. For example, the intensity (e.g., the dose rate, etc.) of the radiation 81 that corresponds to reducing the absolute value of the difference between the combinations of the detected first and second signals S1 and S2 and the stored first and second signals S1 and S2 is used as the target intensity. For example, the target intensity of the radiation 81 can be derived from the values of the detected first and second signals S1 and S2 without using information relating to the applied voltage. For example, the intensity of the radiation 81 can be derived with high accuracy even when the applied voltage changes. The information that is stored in the memory part 76, etc., may include a coefficient relating to the intensity of the radiation 81 and the first and second signals S1 and S2. The radiation amount of the radiation 81 that is absorbed by the substance can be determined from the combination of the first and second signals S1 and S2.

For example, information that relates to the characteristics illustrated in FIG. 5 is pre-acquired and stored for multiple applied voltages and multiple currents Ir. The current Ir can be determined by comparing the stored information and the detected combination of the first and second signals S1 and S2. The intensity (e.g., the dose rate, etc.) of the radiation 81 is obtained based on the current Ir. For example, the combination of the applied voltage and the current Ir can be determined by comparing the stored information and the detected combination of the first and second signals S1 and S2. The intensity (e.g., the dose rate, etc.) of the radiation 81 is obtained based on the applied voltage and the current Ir. For example, the product of the current Ir and a coefficient corresponding to the applied voltage is the intensity of the radiation 81.

For example, there is a first reference example that includes one detecting part. In such a case, the detected signal (e.g., the first signal S1) is obtained for multiple combinations of the applied voltage and the current Ir. In the first reference example, for example, the current Ir can be determined from the detected signal when the applied voltage is known. However, for example, when the actual applied voltage is shifted from the applied voltage that is set, an error occurs in the current Ir that is derived from the detected signal in the first reference example. In the first reference example, the applied voltage is measured in addition to the detection signal obtained from the detector. When the applied voltage is modified when irradiating the radiation 81, the error is included even more easily in the value of the current Ir that is derived from the detection signal and the value of the applied voltage at each time and is necessary to determine the intensity of the radiation 81. In the first reference example, it is difficult to detect the temporally-changing radiation 81 in real time with high accuracy.

Conversely, according to the embodiment, the intensity of the radiation 81 can be determined based on multiple signals obtained from multiple detecting parts. For example, the combination of the applied voltage and the current Ir can be uniquely determined based on the multiple signals obtained from the multiple detecting parts. The intensity of the radiation 81 that is determined from this combination is accurate.

For example, according to the embodiment, the value of the applied voltage is determined as one value at each time. Therefore, an accurate detection is possible even when the actual applied voltage is shifted from the set value. According to the embodiment, for example, even when the applied voltage is modified when irradiating the radiation 81, the current Ir and the value of the applied voltage are accurately determined at each time in the process of changing the applied voltage to the set value. According to the embodiment, the temporally-changing radiation 81 can be detected in real time with high accuracy. According to the embodiment, a radiation detector can be provided in which the detection accuracy can be increased.

Thus, according to the embodiment, the processor 70 is configured to acquire the first signal S1 from the first detecting part 10E when the radiation 81 to be detected is incident on the first detecting part 10E, and configured to acquire the second signal S2 from the second detecting part 20E when the radiation 81 is incident on the second detecting part 20E. The processor 70 is configured to output the detection signal Sd that corresponds to the intensity of the radiation 81 based on the first and second signals S1 and S2. For example, the processor 70 is configured to output the detection signal Sd that corresponds to the intensity of the radiation 81 based on one signal of the first signal S1 or the second signal S2 and the difference between the first signal S1 and the second signal S2.

For example, the first information I1 that relates to the dose rate of the radiation 81, one signal of the first signal S1 or the second signal S2, and the difference between the first signal S1 and the second signal S2 is pre-acquired. The processor 70 derives the detection signal Sd based on the acquired first information I1, the one signal, and the difference. The first information I1 includes, for example, second information that relates to the relationship between the first and second signals S1 and S2 and the current Ir that is supplied to the radiation generator 85 that generates the radiation 81. The second information I2 may include, for example, information that relates to the relationship between the first and second signals S1 and S2, the applied voltage, and the current Ir that is supplied to the radiation generator 85 to generate the radiation 81. The second information is, for example, a coefficient. The processor 70 calculates and outputs the detection signal Sd based on the first information I1 that includes the coefficient, one signal of the first signal S1 or the second signal S2, and the difference between the first signal S1 and the second signal S2. For example, an appropriate coefficient is selected based on the multiple signals obtained from the multiple detecting parts; and the detection signal Sd is derived from the multiple signals and the selected coefficient. The radiation detector according to the embodiment may include the memory part 76 that stores at least a portion of the first information I1 described above. According to the embodiment, a radiation detector is provided in which the detection accuracy can be increased.

For example, there is a second reference example that includes an inorganic material as a detection layer. In the second reference example, silicon or the like is used as the detection layer (a semiconductor layer or a photoelectric conversion layer). In such a case, the signal (the detection current) that is obtained from the detection layer nonlinearly changes with respect to the current Ir of the radiation generator 85. For example, the detection current changes at a high change rate when the current Ir is small; and when the current Ir is large, the change rate decreases, and the detection current saturates. In such a second reference example, even when multiple detecting parts are provided, the detection current nonlinearly changes with respect to the current Ir; therefore, it is difficult to accurately derive the intensity of the radiation 81 even by using the detection currents obtained from the multiple detecting parts.

Conversely, according to the embodiment, the detection layers include organic materials. Therefore, as described with reference to FIG. 5, the multiple detection currents (the first signal S1 and the second signal S2) linearly change with respect to the current Ir. Thereby, the intensity of the radiation 81 can be derived with high accuracy based on the multiple detection currents.

For example, the difference between the magnitude of the first signal S1 and the magnitude of the second signal S2 has a relationship with the proportion of the portion of the energy distribution of the radiation 81 irradiated on the irradiated body 80 that has a high energy. For example, the high energy component that is included in the radiation 81 can be detected by using information obtained from the difference between the magnitude of the first signal S1 and the magnitude of the second signal S2. For example, by controlling the irradiation of the radiation 81 by detecting the high energy component, the excessive irradiation on the irradiated body 80 of high-energy radiation can be suppressed.

For example, the radiation amount of the radiation 81 that is absorbed by the substance can be determined from the combination of the first and second signals S1 and S2. For example, information for controlling the radiation irradiation amount to match the material or size of the irradiated body 80 is obtained.

The value (the magnitude) of the first signal S1 and the value (the magnitude) of the second signal S2 that are detected are different from each other. The combination of the value of the first signal S1 and the value of the second signal S2 can be utilized as an index of the difference between energy components included in the radiation 81 before being irradiated on the irradiated body 80. For example, the difference between the first signal S1 and the second signal S2 that are detected when the radiation 81 includes many high energy distributions is less than the difference between the first signal S1 and the second signal S2 that are detected when the radiation 81 includes many low energy distributions. By utilizing such an index, for example, the transmissive image of the irradiated body 80 can be obtained with higher accuracy.

According to the embodiment, a third detecting part may be provided in addition to the first and second detecting parts 10E and 20E. For example, the third detecting part has a configuration that is different from those of the first and second detecting parts 10E and 20E. The third detecting part includes, for example, a third layer. The third layer includes at least one of a third material that is different from the first and second materials, or a third thickness that is different from the first and second thicknesses t1 and t2. A higher detection accuracy is obtained by utilizing a third signal obtained from such a third detecting part. For example, by using the third detecting part, the image can be obtained with even higher accuracy.

Figure 6:
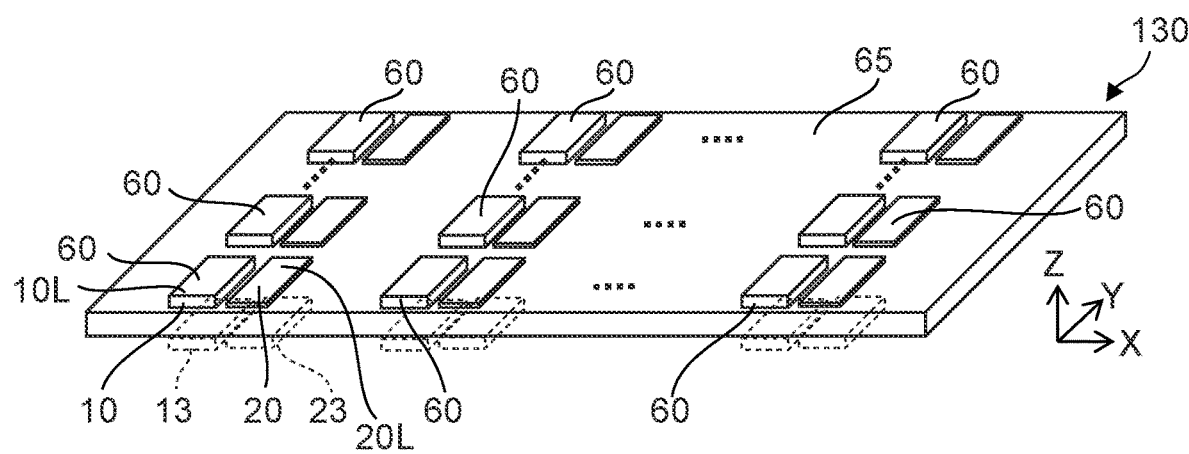
FIG. 6 is a schematic perspective view illustrating a radiation detector according to the first embodiment.

FIG. 6 is a schematic perspective view illustrating a radiation detector according to the first embodiment.

As shown in FIG. 6, the radiation detector 130 according to the embodiment includes the multiple detection components 60. One (e.g., each) of the multiple detection components 60 includes the first detecting part 10E and the second detecting part 20E. The multiple detection components 60 are arranged in a plane (the X-Y plane) that crosses the first direction (the Z-axis direction) from the first organic detection layer 13 toward the first layer 10L. By providing the multiple detection components 60, for example, information that relates to the in-plane distribution of the intensity (e.g., the dose rate) of the radiation 81 is obtained.

According to the embodiment, at least one of the first organic material of the first material of the first layer 10L or the second organic material of the second material of the second layer 20L includes, for example, at least one selected from the group consisting of polystyrene, polyethylene terephthalate, polyamide, polycarbonate, polyimide, and polyetheretherketone.

At least one of the first organic detection layer 13 or the second organic detection layer 23 may include, for example, a p-type semiconductor material and an n-type semiconductor material. The p-type semiconductor material includes, for example, P3HT (Poly(3-hexylthiophene)), etc. The n-type semiconductor material includes, for example, fullerene. The fullerene includes, for example, $PC_{61}BM$ ([6,6]-phenyl-$C_{61}$-butyric acid methyl ester).

Second Embodiment

A second embodiment relates to a radiation detection method.

Figure 7:
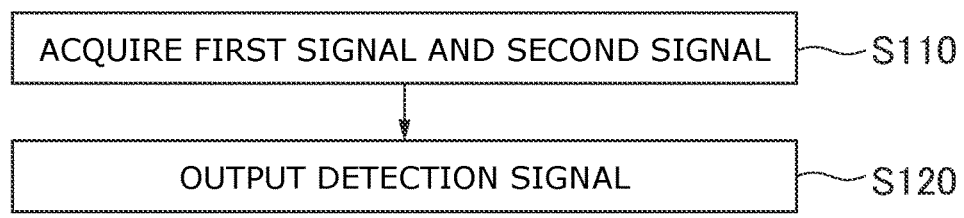
FIG. 7 is a flowchart illustrating the radiation detection method according to the second embodiment.

FIG. 7 is a flowchart illustrating the radiation detection method according to the second embodiment.

As shown in FIG. 7, the radiation detection method according to the embodiment includes acquiring the first signal S1 from the first detecting part 10E when the radiation 81 to be detected is incident on the first detecting part 10E, and acquiring the second signal S2 from the second detecting part 20E when the radiation 81 is incident on the second detecting part 20E (step S110). The radiation detection method includes detecting the intensity (e.g., the dose rate) of the radiation 81 based on the first and second signals S1 and S2 (step S120).

As described with reference to FIG. 1, etc., the first detecting part 10E includes the first organic detection layer 13 and the first layer 10L. The second detecting part 20E includes the second organic detection layer 23. The first layer 10L includes the first material and the first thickness t1. The second detecting part 20E does not include the first layer 10L. The second detecting part 20E does not include the second layer 20L. Or, the second detecting part 20E includes the second layer 20L. The second layer 20L includes at least one of the second material that is different from the first material, or the second thickness t2 that is different from the first thickness t1. The first material includes at least one of the first organic material or the first element. The first element includes at least one selected from the group consisting of Al, Mg, Be, B, C, Fe, Co, Ni, and Cu. The second material includes at least one of the second organic material or the second element. The second element includes at least one selected from the group consisting of Mg, Be, B, C, Fe, Co, Ni, and Cu.

For example, the first information I1 that relates to the dose rate of the radiation 81, one signal of the first signal S1 or the second signal S2, and the difference between the first signal S1 and the second signal S2 may be used. The detection signal Sd may be derived based on the first information I1, the one signal, and the difference.

According to the second embodiment, the first detecting part 10E may include the first scintillator layer; and the second detecting part 20E may include the second scintillator layer 20S (referring to FIGS. 3 and 4). The first scintillator layer 10S is between the first organic detection layer 13 and the first layer 10L. When the second detecting part 20E includes the second layer 20L, the second scintillator layer 20S is between the second organic detection layer 23 and the second layer 20L. When the second detecting part 20E does not include the second layer 20L, the second scintillator layer 20S is stacked with the second organic detection layer 23. Because the scintillator layer is provided, detection is possible with higher sensitivity.

According to the second embodiment, a radiation detection method can be provided in which the detection accuracy can be increased.

An organic detection layer is used in the radiation detector and the radiation detection method according to the embodiment. The organic detection layer has high transmissivity to the radiation 81 (e.g., the X-rays). The organic detection layer has a wide dynamic range for the radiation 81. According to the embodiment, for example, the real-time dose rate can be derived for radiation exposure management. According to the embodiment, for example, the radiation sensor can be prevented from appearing in the X-ray image when imaging a medical X-ray image.

Embodiments may include the following configurations (e.g., technological proposals).

Configuration 1

A radiation detector, comprising:
a first detecting part including a first organic detection layer and a first layer; and
a second detecting part including a second organic detection layer,
the first layer including a first material and a first thickness,
the second detecting part not including the first layer,
the second detecting part not including a second layer, or the second detecting part including the second layer that includes at least one of a second material or a second thickness,
the second material being different from the first material,
the second thickness being different from the first thickness,
the first material including at least one of a first organic material or a first element,
the first element including at least one selected from the group consisting of Al, Mg, Be, B, C, Fe, Co, Ni, and Cu,
the second material including at least one of a second organic material or a second element,
the second element including at least one selected from the group consisting of Al, Mg, Be, B, C, Fe, Co, Ni, and Cu.

Configuration 2

The radiation detector according to Configuration 1, wherein
the first detecting part further includes a first electrode and a first counter electrode,
the first electrode is between the first counter electrode and the first layer,
the first organic detection layer is between the first counter electrode and the first electrode,
the second detecting part further includes a second electrode and a second counter electrode, and
the second organic detection layer is between the second counter electrode and the second electrode.

Configuration 3

The radiation detector according to Configuration 1, wherein
the first detecting part includes a first scintillator layer,
the first scintillator layer is between the first organic detection layer and the first layer,
the second detecting part includes a second scintillator layer,
the second scintillator layer is between the second organic detection layer and the second layer when the second detecting part includes the second layer, and the second scintillator layer is stacked with the second organic detection layer when the second detecting part does not include the second layer.

Configuration 4

The radiation detector according to Configuration 3, wherein the first detecting part further includes a first electrode and a first counter electrode, the first organic detection layer is between the first counter electrode and the first layer, the first electrode is between the first organic detection layer and the first layer, the first scintillator layer is between the first electrode and the first layer, the second detecting part further includes a second electrode and a second counter electrode, the second detecting part includes the second layer, the second organic detection layer is between the second counter electrode and the second layer, the second electrode is between the second organic detection layer and the second layer, and the second scintillator layer is between the second electrode and the second layer.

Configuration 5

The radiation detector according to Configuration 3, wherein the first detecting part further includes a first electrode and a first counter electrode, the first organic detection layer is between the first counter electrode and the first layer, the first electrode is between the first organic detection layer and the first layer, the first scintillator layer is between the first electrode and the first layer, the second detecting part further includes a second electrode and a second counter electrode, the second detecting part does not include the second layer, the second organic detection layer is between the second counter electrode and the second scintillator layer, and the second electrode is between the second organic detection layer and the second scintillator layer.

Configuration 6

The radiation detector according to Configuration 4 or 5, wherein a transmittance of the first electrode for a first peak wavelength of light emitted from the first scintillator layer is greater than a transmittance of the first counter electrode for the first peak wavelength, and a transmittance of the second electrode for a second peak wavelength of light emitted from the second scintillator layer is greater than a transmittance of the second counter electrode for the second peak wavelength.

Configuration 7

The radiation detector according to Configuration 6, wherein a light transmittance of the first counter electrode for the first peak wavelength is greater than a light reflectance of the first electrode for the first peak wavelength, and a light reflectance of the second counter electrode for the second peak wavelength is greater than a light reflectance of the second electrode for the second peak wavelength.

Configuration 8

The radiation detector according to any one of Configurations 3 to 7, wherein the first scintillator layer and the second scintillator layer include a third organic material.

Configuration 9

The radiation detector according to Configuration 8, wherein the first material includes the first organic material, and a refractive index of the first organic material is less than a refractive index of the third organic material.

Configuration 10

The radiation detector according to any one of Configurations 1 to 9, wherein a transmittance of the first detecting part for radiation to be detected is not less than 80%, and a transmittance of the second detecting part for the radiation is not less than 80%.

Configuration 11

The radiation detector according to any one of Configurations 1 to 9, further comprising:

a processor, the processor being configured to acquire a first signal from the first detecting part when radiation to be detected is incident on the first detecting part, and configured to acquire a second signal from the second detecting part when the radiation is incident on the second detecting part, the processor being configured to output a detection signal corresponding to an intensity of the radiation based on the first and second signals.

Configuration 12

The radiation detector according to Configuration 11, wherein the processor derives the detection signal based on:

one signal of the first signal or the second signal;

a difference between the first signal and the second signal; and first information relating to the one signal, the difference, and a dose rate of the radiation.

Configuration 13

The radiation detector according to Configuration 12, wherein the first information includes second information relating to a relationship between:

a current supplied to a radiation generator to generate the radiation; and the first and second signals.

Configuration 14

The radiation detector according to Configuration 13, further comprising:

a memory part configured to store the first information.

Configuration 15

The radiation detector according to any one of Configurations 10 to 14, wherein the radiation includes X-rays.

Configuration 16

The radiation detector according to any one of Configurations 10 to 15, further comprising:

a first connection member electrically connecting the first detecting part and the processor; and a second connection member electrically connecting the second detecting part and the processor, transmittances for the radiation of at least a portion of the first connection member and at least a portion of the second connection member being not less than 90%.

Configuration 17

The radiation detector according to any one of Configurations 1 to 16, further comprising:

a plurality of detection components, one of the plurality of detection components including the first and second detecting parts, the plurality of detection components being arranged in a plane crossing a first direction, the first direction being from the first organic detection layer toward the first layer.

Configuration 18

A radiation detection method, comprising:

acquiring a first signal from a first detecting part when radiation to be detected is incident on the first detecting part;

acquiring a second signal from a second detecting part when the radiation is incident on the second detecting part; and detecting an intensity of the radiation based on the first and second signals, the first detecting part including a first organic detection layer and a first layer, the second detecting part including a second organic detection layer, the first layer including a first material and a first thickness, the second detecting part not including the first layer, the second detecting part not including a second layer, or the second detecting part including the second layer that includes at least one of a second material or a second thickness, the second material being different from the first material, the second thickness being different from the first thickness, the first material including at least one of a first organic material or a first element, the first element including at least one selected from the group consisting of Al, Mg, Be, B, C, Fe, Co, Ni, and Cu, the second material including at least one of a second organic material or a second element, the second element including at least one selected from the group consisting of Al, Mg, Be, B, C, Fe, Co, Ni, and Cu.

Configuration 19

The radiation detection method according to Configuration 18, wherein the detection signal is derived based on:
one signal of the first signal or the second signal;
a difference between the first signal and the second signal; and
first information relating to the one signal, the difference, and a dose rate of the radiation.

Configuration 20

The radiation detection method according to Configuration 18 or 19, wherein the first detecting part includes a first scintillator layer, the first scintillator layer is between the first organic detection layer and the first layer, the second detecting part includes a second scintillator layer, the second scintillator layer is between the second organic detection layer and the second layer when the second detecting part includes the second layer, and the second scintillator layer is stacked with the second organic detection layer when the second detecting part does not include the second layer.

According to the embodiments, a radiation detector and a radiation detection method can be proposed, in which detection accuracy is possible to be improved.

In the specification, "a state of being electrically connected" includes a state in which multiple conductors physically contacts and a current flows between the multiple conductors. "The state of being electrically connected" includes a state in which another conductor is inserted between the multiple conductors and a current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as electrodes, layers, organic detection layers, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors, and radiation detection methods practicable by an appropriate design modification by one skilled in the art based on the radiation detectors, and the radiation detection methods described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a first detecting part including a first organic detection layer and a first layer; and
a second detecting part including a second organic detection layer,
the first layer including a first material and a first thickness,
the second detecting part not including the first layer,
the second detecting part not including a second layer, or the second detecting part including the second layer that includes at least one of a second material or a second thickness,
the second material being different from the first material,
the second thickness being different from the first thickness,
the first material including at least one of a first organic material or a first element,
the first element including at least one selected from the group consisting of Al, Mg, Be, B, C, Fe, Co, Ni, and Cu,
the second material including at least one of a second organic material or a second element,
the second element including at least one selected from the group consisting of Al, Mg, Be, B, C, Fe, Co, Ni, and Cu, wherein
the first detecting part further includes a first electrode and a first counter electrode,
the first electrode is between the first counter electrode and the first layer,
the first organic detection layer is between the first counter electrode and the first electrode,
the second detecting part further includes a second electrode and a second counter electrode, and
the second organic detection layer is between the second counter electrode and the second electrode.

2. A radiation detector, comprising:
a first detecting part including a first organic detection layer and a first layer; and
a second detecting part including a second organic detection layer,
the first layer including a first material and a first thickness,
the second detecting part not including the first layer,
the second detecting part not including a second layer, or the second detecting part including the second layer that includes at east one of a second material or a second thickness,
the second material being different from the first material, the second thickness being different from the first thickness,
the first material including at least one of a first organic material or a first element,
the first element including at least one selected from the group consisting of Al, Mg, Be, B, C, Fe, Co, Ni, and Cu,
the second material including at least one of a second organic material or a second element,
the second element including at least one selected from the group consisting of Al, Mg, Be, B, C, Fe, Co, Ni, and Cu,
wherein
the first detecting part includes a first scintillator layer,
the first scintillator layer is between the first organic detection layer and the first layer,
the second detecting part includes a second scintillator layer,
the second scintillator layer is between the second organic detection layer and the second layer when the second detecting part includes the second layer, and
the second scintillator layer is stacked with the second organic detection layer when the second detecting part does not include the second layer.

3. The radiation detector according to claim 2, wherein
the first detecting part further includes a first electrode and a first counter electrode,
the first organic detection layer is between the first counter electrode and the first layer,
the first electrode is between the first organic detection layer and the first layer,
the first scintillator layer is between the first electrode and the first layer,
the second detecting part further includes a second electrode and a second counter electrode,
the second detecting part includes the second layer,
the second organic detection layer is between the second counter electrode and the second layer,
the second electrode is between the second organic detection layer and the second layer, and
the second scintillator layer is between the second electrode and the second layer.

4. The radiation detector according to claim 2, wherein
the first detecting part further includes a first electrode and a first counter electrode,
the first organic detection layer is between the first counter electrode and the first layer,
the first electrode is between the first organic detection layer and the first layer,
the first scintillator layer is between the first electrode and the first layer,
the second detecting part further includes a second electrode and a second counter electrode,
the second detecting part does not include the second layer,
the second organic detection layer is between the second counter electrode and the second scintillator layer, and
the second electrode is between the second organic detection layer and the second scintillator layer.

5. The radiation detector according to claim 3, wherein
a transmittance of the first electrode for a first peak wavelength of light emitted from the first scintillator layer is greater than a transmittance of the first counter electrode for the first peak wavelength, and
a transmittance of the second electrode for a second peak wavelength of light emitted from the second scintillator layer is greater than a transmittance of the second counter electrode for the second peak wavelength.

6. The radiation detector according to claim 5, wherein
a light transmittance of the first counter electrode for the first peak wavelength is greater than a light reflectance of the first electrode for the first peak wavelength, and
a light reflectance of the second counter electrode for the second peak wavelength is greater than a light reflectance of the second electrode for the second peak wavelength.

7. The radiation detector according to claim 2, wherein
the first scintillator layer and the second scintillator layer include a third organic material.

8. The radiation detector according to claim 7, wherein
the first material includes the first organic material, and
a refractive index of the first organic material is less than a refractive index of the third organic material.

9. A radiation detector, comprising:
a first detecting part including a first organic detection layer and a first layer; and
a second detecting part including a second organic detection layer,
the first layer including a first material and a first thickness,
the second detecting part not including the first layer,
the second detecting part not including a second layer, or the second detecting part including the second layer that includes at least one of a second material or a second thickness,
the second material being different from the first material, the second thickness being different from the first thickness,
the first material including at least one of a first organic material or a first element,
the first element including at least one selected from the group consisting of Al, Mg, Be, B, C, Fe, Co, Ni, and Cu,
the second material including at east one of a second organic material or a second element,
the second element including at least one selected from the group consisting of Al, Mg, Be, B, C, Fe, Co, Ni, and Cu, wherein
a transmittance of the first detecting part for radiation to be detected is not less than 80%, and
a transmittance of the second detecting part for the radiation is not less than 80%.

10. The radiation detector according to claim 9, wherein the radiation includes X-rays.

11. The radiation detector according to claim 9, further comprising:
a processor,
the processor being configured to acquire a first signal from the first detecting part when radiation to be detected is incident on the first detecting part, and configured to acquire a second signal from the second detecting part when the radiation is incident on the second detecting part,
the processor being configured to output a detection signal corresponding to an intensity of the radiation based on the first and second signals.

12. The radiation detector according to claim 11, wherein the processor derives the detection signal based on:
one signal of the first signal or the second signal;
a difference between the first signal and the second signal; and
first information relating to the one signal, the difference, and a dose rate of the radiation.

13. The radiation detector according to claim 12, wherein the first information includes second information relating to a relationship between:
a current supplied to a radiation generator to generate the radiation; and
the first and second signals.

14. A radiation detector, comprising:
a first detecting part including a first organic detection layer and a first layer; and
a second detecting part including a second organic detection layer, and
a processor,
the first layer including a first material and a first thickness,
the second detecting part not including the first layer,
the second detecting part not including a second layer, or the second detecting part including the second layer that includes at least one of a second material or a second thickness,
the second material being different from the first material, the second thickness being different from the first thickness,
the first material including at least one of a first organic material or a first element,
the first element including at least one selected from the group consisting of Al, Mg, Be, B, C, Fe, Co, Ni, and Cu,
the second material including at least one of a second organic material or a second element,
the second element including at least one selected from the group consisting of Al, Mg, Be, B, C, Fe, Co, Ni, and Cu,
the processor being configured to acquire a first signal from the first detecting part when radiation to be detected is incident on the first detecting part, and configured to acquire a second signal from the second detecting part when the radiation is incident on the second detecting part,
the processor being configured to output a detection signal corresponding to an intensity of the radiation based on the first and second signals,
wherein
the processor derives the detection signal based on:
one signal of the first signal or the second signal;
a difference between the first signal and the second signal; and
first information relating to the one signal, the difference, and a dose rate of the radiation,
wherein
the first information includes second information relating to a relationship between:
a current supplied to a radiation generator to generate the radiation; and
the first and second signals.

15. The radiation detector according to claim 14, further comprising:
a memory part configured to store the first information.

16. The radiation detector according to claim 14, further comprising:
a first connection member electrically connecting the first detecting part and the processor; and
a second connection member electrically connecting the second detecting part and the processor,
transmittances for the radiation of at least a portion of the first connection member and at least a portion of the second connection member being not less than 90%.

17. The radiation detector according to claim 14, further comprising:
a plurality of detection components,
one of the plurality of detection components including the first and second detecting parts,
the plurality of detection components being arranged in a plane crossing a first direction,
the first direction being from the first organic detection layer toward the first layer.

18. A radiation detection method, comprising:
acquiring a first signal from a first detecting part when radiation to be detected is incident on the first detecting part;
acquiring a second signal from a second detecting part when the radiation is incident on the second detecting part; and
detecting an intensity of the radiation based on the first and second signals,
the first detecting part including a first organic detection layer and a first layer,
the second detecting part including a second organic detection layer,
the first layer including a first material and a first thickness,
the second detecting part not including the first layer,
the second detecting part not including a second layer, or the second detecting part including the second layer that includes at least one of a second material or a second thickness,
the second material being different from the first material, the second thickness being different from the first thickness,
the first material including at least one of a first organic material or a first element,
the first element including at least one selected from the group consisting of Al, Mg, Be, B, C, Fe, Co, Ni, and Cu,
the second material including at least one of a second organic material or a second element,
the second element including at least one selected from the group consisting of Al, Mg, Be, B, C, Fe, Co, Ni, and Cu, wherein
the first detecting part includes a first scintillator layer,
the first scintillator layer is between the first organic detection layer and the first layer,
the second detecting part includes a second scintillator layer,
the second scintillator layer is between the second organic detection layer and the second layer when the second detecting part includes the second layer, and
the second scintillator layer is stacked with the second organic detection layer when the second detecting part does not include the second layer.

19. The radiation detection method according to claim 18, wherein
the detection signal is derived based on:
one signal of the first signal or the second signal;
a difference between the first signal and the second signal; and
first information relating to the one signal, the difference, and a dose rate of the radiation.

\* \* \* \* \*